United States Patent

Takaoka et al.

[11] Patent Number: 5,822,349
[45] Date of Patent: Oct. 13, 1998

[54] SEMICONDUCTOR DEVICE AND METHOD OF MANUFACTURING THE SAME

[75] Inventors: Keiji Takaoka, Kawasaki; Mitsuhiro Kushibe; Toshihide Izumiya, both of Tokyo; Yoshihiro Kokubun, Yokohama, all of Japan

[73] Assignee: Kabushiki Kaisha Toshiba, Kawasaki, Japan

[21] Appl. No.: 614,210

[22] Filed: Mar. 12, 1996

[30] Foreign Application Priority Data

Mar. 15, 1995 [JP] Japan ................................. 7-055289

[51] Int. Cl.⁶ ............................................ H01S 3/19
[52] U.S. Cl. ...................................... 372/46; 372/46
[58] Field of Search ................................ 372/45, 46, 47

[56] References Cited

U.S. PATENT DOCUMENTS

| | | | |
|---|---|---|---|
| 4,901,326 | 2/1990 | Hayakawa et al. | 372/44 |
| 4,941,146 | 7/1990 | Kobayashi | 372/45 |
| 5,034,957 | 7/1991 | Ohba et al. | 372/45 |
| 5,170,404 | 12/1992 | Ohtoshi et al. | 372/43 |
| 5,271,028 | 12/1993 | Kondo et al. | 372/45 |
| 5,441,912 | 8/1995 | Tsukiji et al. | 437/129 |
| 5,568,501 | 10/1996 | Otsuka et al. | 372/46 |
| 5,596,591 | 1/1997 | Kawano | 372/46 |

OTHER PUBLICATIONS

Y. Ohkura, et al. "Low Threshold FS–BH Laser on P–INP Substrate Grown by ALL–MOCVD", *Electronic Letters*, Sep. 10, 1992, vol. 28, No. 19, pp. 1844–1845.

Primary Examiner—Rodney B. Bovernick
Assistant Examiner—Ellen Eunjoo Kang
Attorney, Agent, or Firm—Oblon, Spivak, McClelland, Maier & Neustadt, P.C.

[57] ABSTRACT

This invention is a semiconductor device including a p-type InP substrate having a mesa stripe in which at least an active layer and an n-type cladding layer are formed, and a semiconductor layer so formed as to bury the side surfaces of the mesa stripe and having at least an n-type current blocking layer and a p-type current blocking layer, wherein the n-type current blocking layer contains approximately $8 \times 10^{17}$ cm$^{-3}$ or more of Se as an impurity and the n-type current blocking layer and the n-type cladding layer are not contacting each other.

8 Claims, 5 Drawing Sheets

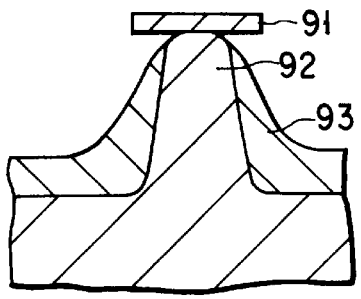
Se CONCENTRATION:
APPROXIMATELY $1 \times 10^{18} cm^{-3}$ OR LESS
F I G. 3A
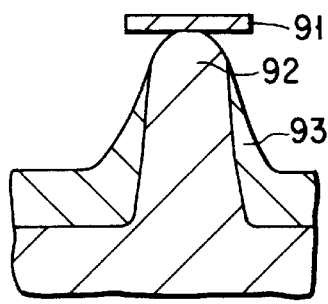
Se CONCENTRATION:
APPROXIMATELY $5 \times 10^{18} cm^{-3}$
F I G. 3B
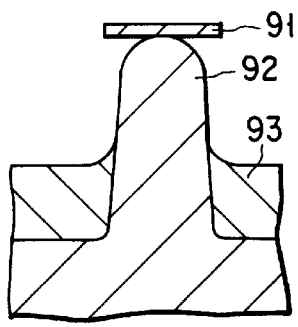
F I G. 3C
Se CONCENTRATION:
APPROXIMATELY $2 \times 10^{19} cm^{-3}$
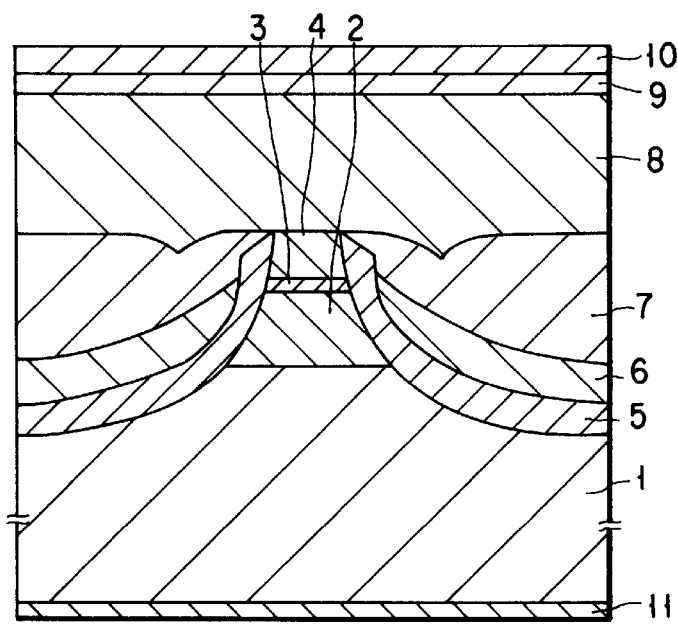
F I G. 4

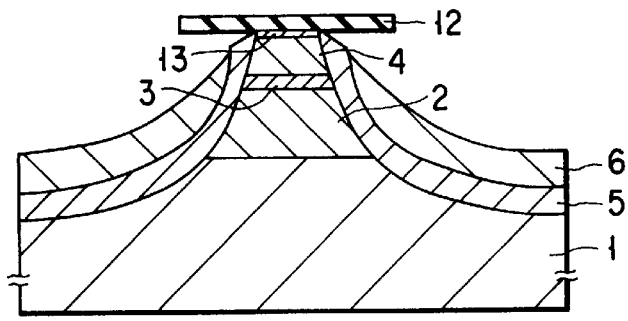
F I G. 6A
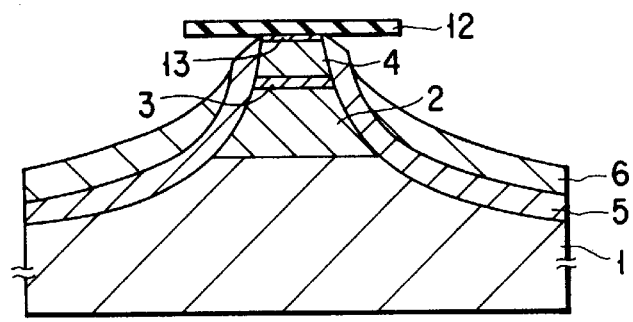
F I G. 6B
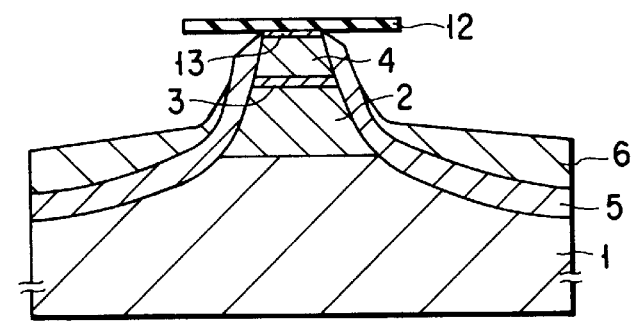
F I G. 6C
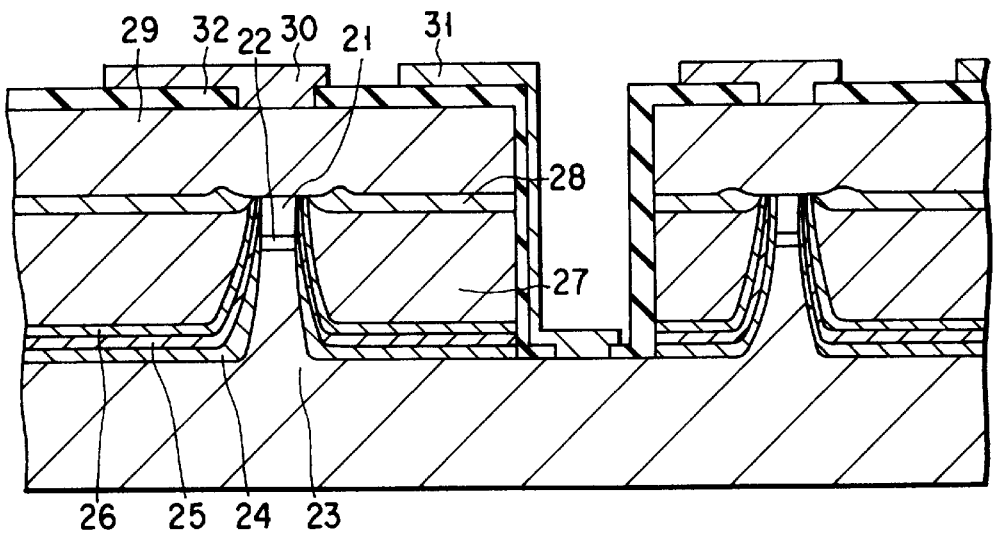
F I G. 7

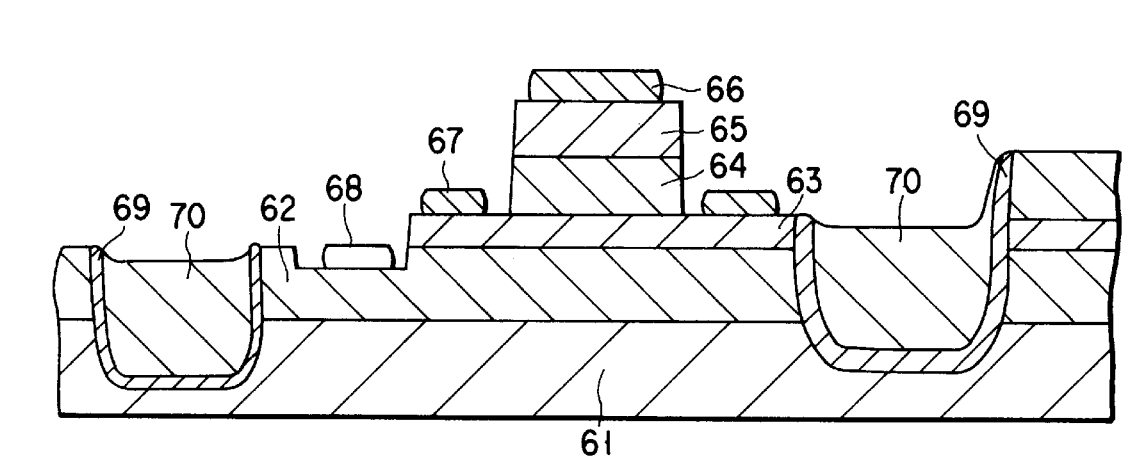
F I G. 8
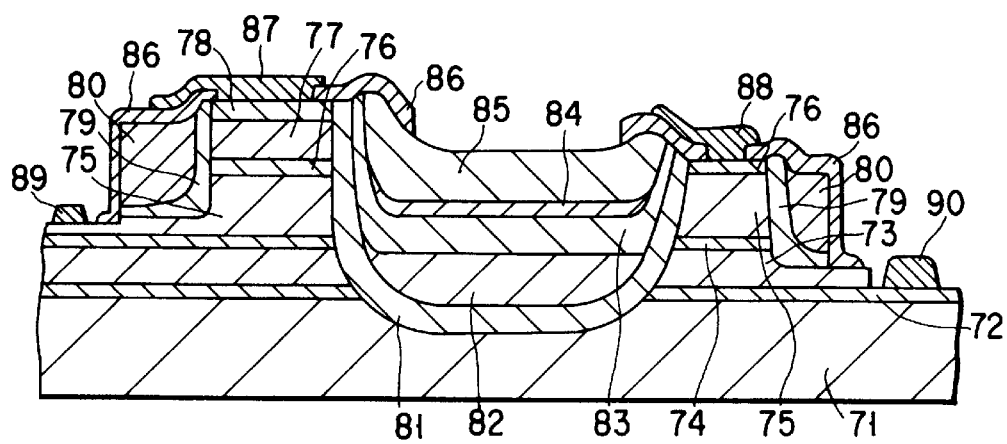
F I G. 9
F I G. 10

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

2. Description of the Related Art

The first subject of the present invention is as follows.

Recently, parallel optical transmission using a semiconductor laser array has attracted attention. In this system, in order to match a driving circuit constituted by npn transistors which are advantageous to a high-speed operation to a semiconductor laser array, it is necessary to manufacture the semiconductor laser array on a p-type semiconductor substrate. In the manufacture of semiconductor lasers, the general approach is to use metal organic chemical vapor deposition (to be referred to as MOCVD hereinafter) having a high uniformity in the device characteristics and a high mass-productivity.

One conventional example of a semiconductor laser formed on a p-type semiconductor substrate by using MOCVD will be described below with reference to FIG. 1.

FIG. 1 is a sectional view showing the structure of this conventional semiconductor laser formed on a p-type semiconductor substrate by using MOCVD. This semiconductor laser is manufactured by the following procedure. First, a p-type InP buffer layer 102, an InGaAsP active layer 103 with an emission wavelength of 1.3 $\mu$m, an n-type InP cladding layer 104, and an n-type InGaAs etching dummy layer are formed in this order on a p-type InP substrate 101 by MOCVD. After an $SiO_2$ mask is formed into a stripe in the <011> direction, a mesa stripe about 3 $\mu$m in height is formed by etching.

With the $SiO_2$ mask left behind, a p-type InP buried layer 105, an n-type InP current blocking layer 106, and a p-type InP current blocking layer 107 are selectively formed in this order on the side surfaces of the mesa stripe by MOCVD. After the $SiO_2$ mask and the n-type InGaAs etching dummy layer are removed, an n-type InP cladding layer 108 and an n-type InGaAs contact layer 109 are formed on the overall surface by MOCVD. Finally, electrode 110 is formed on the n-type InGaAs contact layer 109, the substrate 101 is polished, electrode 111 is formed on the substrate 101, and the resultant structure is cleaved into discrete semiconductor laser chips. In this way the semiconductor laser shown in FIG. 1 is manufactured.

In the semiconductor laser with the above structure, a current is efficiently injected into the InGaAsP active layer 103 by the current blocking layers 106 and 107 constituting the pnpn thyristor structure on the two sides of the InGaAsP active layer 103. In the semiconductor laser with the structure shown in FIG. 1, it is important to isolate the n-type InP cladding layer 104, 108 from the n-type InP current blocking layer 106 in order to obtain good device characteristics with little leakage current. This is because if the n-type InP cladding layer 104, 108 is connected to the n-type InP current blocking layer 106, a very large leakage current flows into the surrounding pnpn thyristor structure formed for current blocking. This leakage current is particularly large when a high current is injected or at high temperatures. To realize a high-output operation or a high-temperature operation, therefore, it is essential to isolate the n-type InP cladding layer 104, 108 from the n-type InP current blocking layer 106.

The way this structure is formed on the side surfaces of the InGaAsP active layer 103 will be described with reference to FIGS. 2A to 2C (this method is described in, e.g., ELECTRONICS LETTER Vol. 28, No. 19, p. 1844). Reference numeral 112 in FIGS. 2A to 2C denote an $SiO_2$ mask used in mesa etching and selective growth for burying. First, as illustrated in FIG. 2A, a p-type InP buried layer 105 is selectively formed on the side surfaces of the mesa stripe. Consequently, a (111) B face and a (221) B face whose growth rates are very low are formed on the side surfaces of the mesa stripe. Subsequently, as shown in FIG. 2B, an n-type InP current blocking layer 106 is formed to the extent to which the (221) B face is not completely buried. Finally, as illustrated in FIG. 2C, a p-type InP current blocking layer 107 is formed.

When the semiconductor layers are formed on the side surfaces of the mesa stripe as described above, the n-type InP grows very slowly on the (111) B face and the (221) B face. Consequently, almost no second n-type InP layer grows on the (111) B face formed by the first p-type InP layer, and the n-type InP current blocking layer 106 and the n-type InP cladding layer 104 are not connected, i.e., they are isolated. As described above, the use of the high-order crystal face which appears during the course of burying growth on the side surfaces of the mesa stripe by MOCVD and which has a very low growth rate prevents the n-type InP current blocking layer 106 and the n-type InP cladding layer 104, 108 from being connected to each other. Accordingly, it is possible to obtain a buried semiconductor laser device having good characteristics with little leakage current.

In the above conventional example, however, it is necessary to precisely control all of the height and shape of the mesa stripe, the thickness of the p-type InP buried layer, and the thickness of the n-type InP current blocking layer. As an example, if the thickness of the n-type current blocking layer is very large compared to the length of the (221) face formed on the side surfaces of the mesa stripe, the n-type cladding layer and the n-type current blocking layer connect to each other. To prevent this, the thickness of the n-type current blocking layer is required to control in accordance with the length of the (221) face formed on the side surfaces of the mesa stripe. That is, in this conventional example the mesa etching conditions and the MOCVD conditions is required to precisely controlled, and a device having good characteristics can be obtained only within a very narrow limited range of the conditions.

The second subject of the present invention is as follows.

To electrically insulate one active region in a semiconductor device, an isolation region is formed by insulating the active region by implanting ions around the active region, or is formed by forming a mesa stripe structure around the active region.

To form the isolation region by ion implantation, ions is required to be implanted by the height of the device. Therefore, if the height of the device increases due to an improved performance of each individual active region, a damage done to the device by the ion implantation increases accordingly.

On the other hand, when the isolation region is formed by a mesa stripe, the device structure is complicated and integrated. Accordingly, it is necessary to planarize the device surface. Commonly, the method of planarization is to bury a polyimide in the side surfaces of the mesa stripe or bury a semiconductor material to obtain a semi-insulating property. Unfortunately, the method of burying a polyimide has a problem in reliability. To obtain a semi-insulating property by burying a semiconductor material, on the other hand, a selective growth mask for planarization is formed to overhang to prevent growth higher than the selective growth mask. However, in the vicinity of the mask the material reaching the mask surface also is supplied to the growth surface. This increases the supply amount of the material, causing abnormal growth and making even growth impossible. Additionally, when the area of selective growth is widened, the film is also formed on the mask to lead to low selectivity.

SUMMARY OF THE INVENTION

The present invention has been made in consideration of the above situation and has as its first object to provide a buried semiconductor device having good characteristics with little leakage current.

It is the second object of the present invention to provide a semiconductor device capable of improving the accuracy of a device process of InP-based materials and capable of being integrated.

The first object of the present invention is achieved by a semiconductor device comprising a p-type InP substrate having a mesa stripe on which at least an active layer and an n-type cladding layer are formed, and a semiconductor layer so formed as to bury side surfaces of the mesa stripe and having at least an n-type current blocking layer and a p-type current blocking layer, wherein the n-type current blocking layer contains approximately $8 \times 10^{17}$ cm$^{-3}$ or more of Se as an impurity and the n-type current blocking layer and the n-type cladding layer are not contacting each other.

The first object of the present invention is achieved by a method of manufacturing a semiconductor device, comprising the steps of forming a stacked film of at least an active layer on a p-type InP substrate, processing the stacked film into a mesa stripe shape, forming a semiconductor layer having at least an n-type current blocking layer and a p-type current blocking layer so as to bury side surfaces of the mesa stripe, and forming an n-type cladding layer, wherein approximately $8 \times 10^{17}$ cm$^{-3}$ or more of Se is doped as an impurity into the n-type current blocking layer, thereby forming a structure in which the n-type current blocking layer and the n-type cladding layer are not contacting each other.

The second object of the present invention is achieved by a semiconductor device comprising a base having at least two active regions including an active region formed on a substrate containing InP, and an isolation region for electrically isolating at least a portion of one active region from the other active region, wherein the isolation region has at least a semi-insulating layer and an Se-doped layer containing $5 \times 10^{18}$ to $7 \times 10^{19}$ cm$^{-3}$ of Se as an impurity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A to 3C are sectional views for explaining the relationship between the Se concentration and the flatness of a surface shape after selective growth in the second invention of the present invention;

FIG. 4 is a sectional view showing one embodiment of a semiconductor device according to the first invention of the present invention;

FIGS. 6A to 6C are sectional views showing the shapes of n-type current blocking layers at different Se concentrations;

FIG. 7 is a sectional view showing one embodiment (semiconductor laser array) of a semiconductor device according to the second invention of the present invention; and FIGS. 8 to 10 are sectional views showing other embodiments of the semiconductor device according to the second invention of the present invention.

DETAILED DESCRIPTION OF THE PREFERRED EMBODIMENTS

Figure 1:
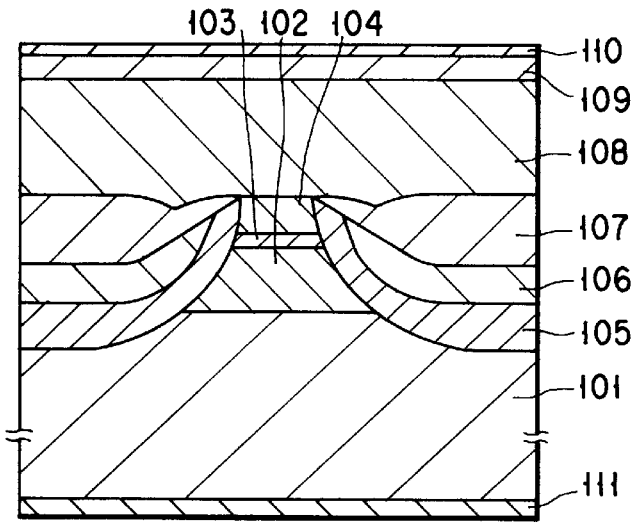
FIG. 1 is a sectional view showing an outline of the structure of a conventional semiconductor laser.
Figure 2A:
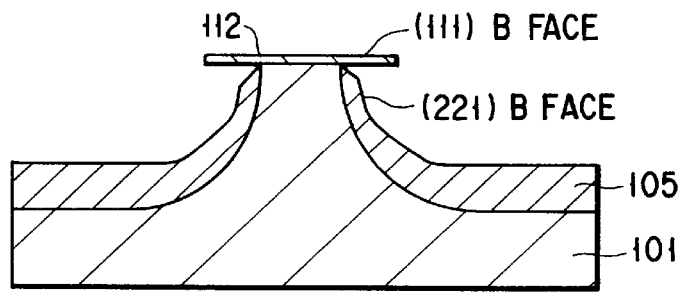
FIGS. 2A to 2C are sectional views showing a burying growth process on the side surfaces of a mesa stripe.
Figure 2B:
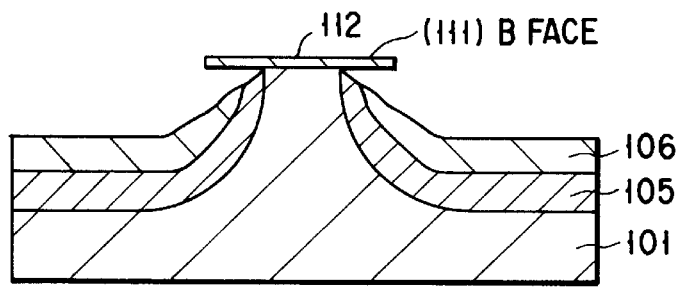
Figure 2C:
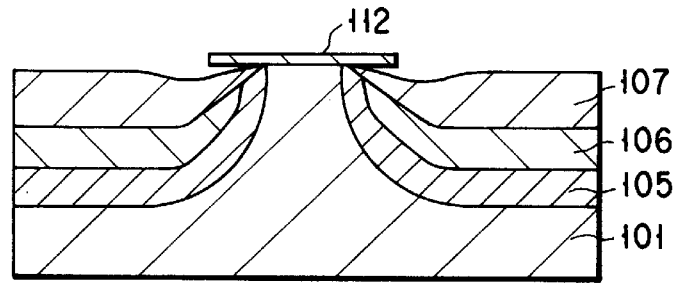

The present inventors have focused attention on the fact that on a surface on which at least two different facet directions are present, if a compound semiconductor of a group III element and a group V element of the periodic table, such as InP, GaAs, or InGaAs, which has the crystal structure of sphalerite, and a mixed crystal thereof are grown with introducing Se or S, the growth rate of the material changes in accordance with the facet directions. The present inventors have found that the shape of a film can be controlled by changing the amount of Se or S in the manufacture of a semiconductor device, and thereby reached the present invention. That is, the present inventors have found that when film formation is performed while the formation of the film in a specific portion is suppressed by changing the amount of Se or S, it is possible to obtain a semiconductor device with a desired shape, e.g., a semiconductor device in which contact between specific films is inhibited. In particular, changing the amount of Se was found to be effective.

The difference between growth rates caused by the difference between facet directions is relatively determined by facet directions that are simultaneously present. For example, when a (100) face and a (111) B face are present and Se exists, the material described above grows preferentially on the (100) face. This effect is enhanced as the amount of Se increases. Accordingly, during film formation the shape of the film can be controlled by adjusting facet directions simultaneously present and the amount of Se or S.

That is, a semiconductor device of the first invention of the present invention is characterized by having a structure in which the side surfaces of a mesa stripe having an active layer and an n-type cladding layer formed on a p-type InP substrate are buried with a semiconductor layer having at least an n-type current blocking layer and a p-type current blocking layer, and in which the n-type current blocking layer contains approximately $8 \times 10^{17}$ cm$^{-3}$ or more of Se as an impurity and the n-type current blocking layer and the n-type cladding layer are not in contact with each other.

The n-type current blocking layer contains about $8 \times 10^{17}$ cm$^{-3}$ or more of Se as an impurity, i.e., the n-type current blocking layer contains Se, as an impurity, at a concentration at which the directly proportional relationship is lost (saturated) in a graph indicating the relationship between the supply amount of the Se material (e.g., $H_2Se$) and the carrier concentration in the n-type current blocking layer. Consequently, the growth of the n-type InP layer on the side surfaces of the mesa stripe is suppressed more than that in conventional devices. This extremely facilitates isolation between the n-type cladding layer and the n-type current cladding layer, which is essential to realize a high-output operation and a high-temperature operation. This phenomenon is enhanced as the doping amount of Se increases.

In the first invention, the material used in the semiconductor layer such as the active layer, the cladding layer, and the current blocking layer is at least one of AlAs, GaAs, InAs, AlP, GaP, and InP, a mixed crystal of these materials, or a multilayered structure formed by combining these materials. The conductivity type, the material type, and the impurity concentration are properly determined in accordance with the intended use.

In the first invention, at least an active layer and an n-type cladding layer are formed in the mesa stripe. Examples of a layer other than the active layer and the n-type cladding layer are an optical guide layer and an etching dummy layer. The semiconductor layer to be buried in the side surfaces of the mesa stripe has at least an n-type current blocking layer and a p-type current blocking layer. Examples of a layer other than these n- and p-type current blocking layers are a p-type InP buried layer, a semi-insulating InP layer, an InGaAlAs layer, an InGaAsP layer, an InGaAs layer, and an InAlAs layer.

In the first invention, the concentration of Se contained in the n-type current blocking layer is set to approximately $8\times10^{17}$ $cm^{-3}$ or more. This is because if the concentration of Se contained in the n-type current blocking layer is lower than about $8\times10^{17}$ $cm^{-3}$, the growth of n-type InP approaches conformal growth, and the n-type current blocking layer and the n-type cladding layer contact each other. The Se concentration is most preferably $2\times10^{18}$ to $5\times10^{19}$ $cm^{-3}$. Note this concentration depends upon, e.g., the mesa stripe shape and the MOCVD conditions.

A semiconductor device of the second invention of the present invention is characterized in that a recessed portion is formed between at least two active regions formed on a substrate, and a semi-insulating layer and an Se-doped layer containing $5\times10^{18}$ to $7\times10^{19}$ $cm^{-3}$ of Se as an impurity are formed in the recessed portion (e.g., a mesa stripe).

In this isolation region, the active regions except for a desired electrode are electrically insulated by the semi-insulating layer.

Also, since the Se-doped layer is formed to have an Se concentration of $5\times10^{18}$ to $7\times10^{19}$ $cm^{-3}$, in the recessed portion of the isolation region the growth to the side surfaces of the recessed portion is suppressed, i.e., the growth preferentially occurs in the direction (the direction of thickness of the device) in which the recessed portion is buried. Consequently, this Se-doped layer evenly buries the recessed portion in the isolation region. The relationships between the Se concentration and the side surfaces of the mesa stripe are illustrated in FIGS. 3A to 3C. FIG. 3A shows a case where the Se concentration is approximately $1\times10^{18}$ $cm^{-3}$ which falls outside the range of the present invention. As in FIG. 3A, if an Se-doped layer 93 is formed on the side surfaces of a mesa stripe 92 by using a selective growth mask 91, the growth of the Se-doped layer 93 to the side surfaces of the mesa stripe 92 proceeds with no large difference from the growth in the direction of thickness of the device. Consequently, the Se-doped layer 93 is not evenly buried. In contrast, when the Se concentration falls within the range of the present invention as illustrated in FIG. 3B or 3C, the growth of the Se-doped layer 93 to the side surfaces of the mesa stripe 92 is suppressed compared to the growth in the direction of thickness of the device. The result is that the Se-doped layer 93 is evenly buried.

In the semiconductor device of the second embodiment of the present invention, the Se-doped layer is formed by setting the Se concentration at $5\times10^{18}$ to $7\times10^{19}$ $cm^{-3}$. This extraordinarily decreases the precipitation amount of a polycrystalline film on the selective growth mask. Consequently, selective growth can be well performed in a wide area.

In the second invention, examples of the element constituting the active region are a semiconductor laser, an optical modulator, an optical amplifier, a waveguide, an LED, a PD, an HEMT, an HBT, a capacitance, a resistor, a transistor, and a diode. By combining these active elements, therefore, the semiconductor device of the second invention of the present invention can be applied to a semiconductor laser, an optical integrated circuit, or an opto-electric integrated circuit (so-called OEIC), or to a common electrical integrated circuit.

In the second invention, the isolation region is formed by forming a recessed portion in a substrate and burying this recessed portion with at least a semi-insulating layer and an Se-doped layer. Examples of a layer other than the semi-insulating layer and the Se-doped layer are a p-type InP layer, an InAlAs layer, an InGaAsP layer, an InGaAs layer, and combinations of these layers, although the usable layer depends upon the type of semiconductor element. As the semi-insulating layer, it is possible to use InP, InGaAsP, InAlAs, or InGaAs, to which a transition metal is doped, or combinations of these compounds.

In the second invention, the concentration of Se contained in the Se-doped layer is set to $5\times10^{18}$ to $7\times10^{19}$ $cm^{-3}$. This is because if the concentration of Se contained in the Se-doped layer is lower than $5\times10^{18}$ $cm^{-3}$, the Se-doped layer cannot be evenly buried. If the Se concentration exceeds $7\times10^{19}$ $cm^{-3}$, the surface is severely roughened. The most preferable range is $1\times10^{19}$ to $6\times10^{19}$ $cm^{-3}$. The concentration of Se means a concentration determined by the van der Pauw Hall measurement method, and its absolute value contains an error of Factor 3.

In the second invention, it is desirable to use MOCVD or CBE (Chemical Beam Epitaxy) as the method of forming the buried layer containing the semi-insulating layer and the Se-doped layer, when supply of hydrogen atoms and vaporization of Se which are assumed to be factors of planarization are taken into consideration.

Embodiments of the present invention will be described in detail below with reference to the accompanying drawings.

(First Embodiment)

FIG. 4 is a sectional view showing one embodiment of a semiconductor device (semiconductor laser) according to the first invention of the present invention. In FIG. 1, reference numeral 1 denotes a p-type InP substrate. A mesa stripe is formed on one major surface of the p-type InP substrate 1. A p-type InP buffer layer 2, an InGaAsP active layer 3, and an n-type InP cladding layer 4 are formed in this order on the mesa stripe. A p-type InP buried layer 5 is formed on the side surfaces of the mesa stripe so as to contact the p-type InP buffer layer 2, the InGaAsP active layer 3, and the n-type InP cladding layer 4. An n-type InP current blocking layer 6 is formed on the p-type InP buried layer 5, and a p-type InP current blocking layer 7 is formed on the n-type InP current blocking layer 6. The n-type InP current blocking layer 6 and the n-type InP cladding layer 4 are reliably isolated from each other. Furthermore, an n-type InP cladding layer 8 is formed on the p-type InP current blocking layer 7, and an n-side electrode 10 is formed above the n-type InP cladding layer 8 via an n-type InGaAs contact layer 9. Also, a p-side electrode 11 is formed on the other major surface of the p-type InP substrate 1.

Figure 5A:
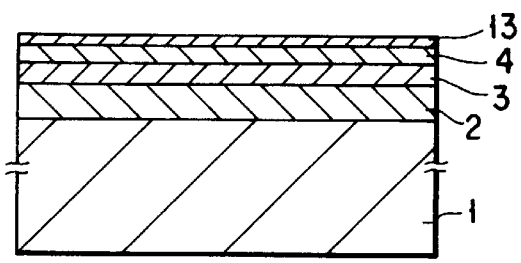
FIGS. 5A to 5F are sectional views showing the manufacturing steps of the semiconductor device in FIG. 4.

The manufacturing steps of the semiconductor laser with the above structure and the details of the individual portions will be described below with reference to FIGS. 5A to 5F. First, as illustrated in FIG. 5A, a 2-$\mu$m thick p-type InP buffer layer 2 with a p-type impurity concentration of $1\times10^{18}$ cm$^{-3}$, an InGaAsP active layer 3, a 0.7-$\mu$m thick n-type InP cladding layer 4 with an n-type impurity concentration of $1\times10^{18}$ cm$^{-3}$, and an n-type InGaAs etching dummy layer 13 are formed in this order on a p-type InP substrate 1 by using MOCVD.

Figure 5B:
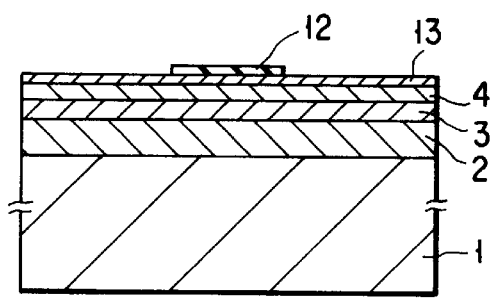
Figure 5C:
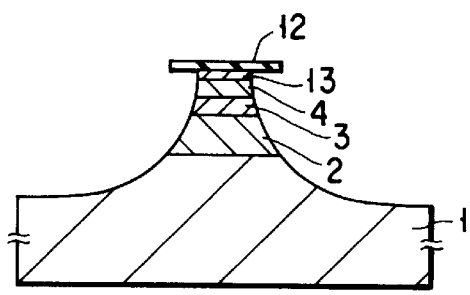

As illustrated in FIG. 5B, a 5-$\mu$m wide SiO$_2$ stripe mask 12 is formed in the <011> direction. This stripe mask is etched to form a mesa stripe 3 $\mu$m in height as shown in FIG. 5C. The etchant used was prepared by mixing bromine, hydrobromic acid, and water, and the etching was done with the wafer held immobile in the etchant.

Figure 5D:
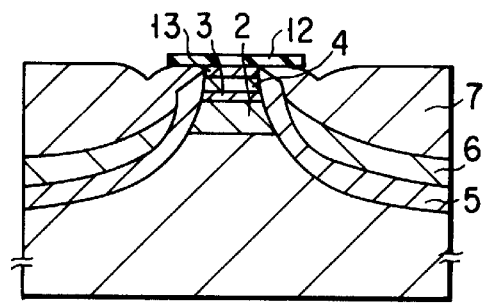

Subsequently, as illustrated in FIG. 5D, with the SiO$_2$ mask 12 left behind a 0.6-$\mu$m thick p-type InP buried layer 5 with a p-type impurity concentration of $1\times10^{18}$ cm$^{-3}$, a 1.0-$\mu$m thick n-type InP current blocking layer 6 with an n-type impurity concentration of $6\times10^{18}$ cm$^{-3}$, and a 1.4$\mu$m thick p-type InP current blocking layer 7 with a p-type impurity concentration of $1\times10^{18}$ cm$^{-3}$ are formed in this order by MOCVD. Zn was used as the p-type impurity, and Se was used as the n-type impurity. Note that layers (not shown) containing both Zn and Se are present in the interface between the p-type InP buried layer 5 and the n-type InP current blocking layer 6 and the interface between the n-type InP current blocking layer 6 and the p-type InP current blocking layer 7. The layer in the interface between the n-type InP current blocking layer 6 and the p-type InP current blocking layer 7 is thicker than the other.

In this structure, a (111) B face and a (221) B face appear on the side surfaces of the mesa stripe when the p-type InP buried layer 5 is formed as the first layer. The Se-doped n-type InP current blocking layer 6 as the second layer hardly grows on the (111) B face and the (221) B face on the side surfaces of the mesa stripe. The use of Se as the n-type impurity decreases the growth rate of the n-type InP current blocking layer 6 on the (111) B face and the (221) B face compared to conventional devices.

Figure 5E:
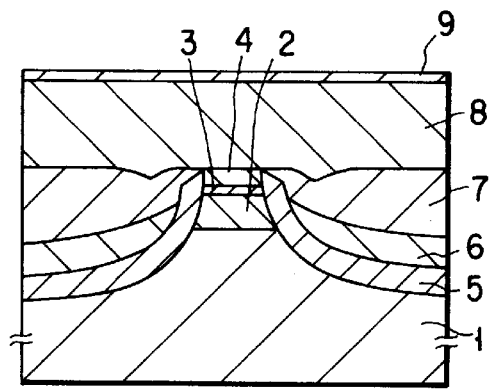
Figure 5F:
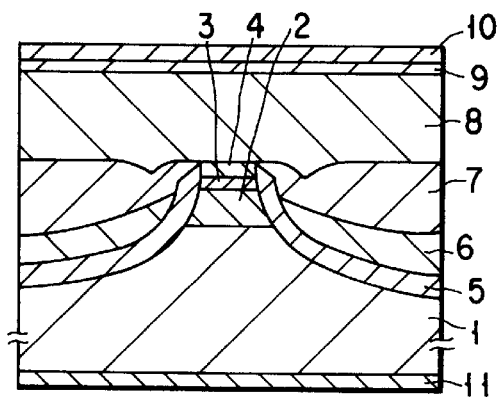

Subsequently, as shown in FIG. 5E, the SiO$_2$ mask 12 and the InGaAs etching dummy layer 13 are removed, and a 1.4-$\mu$m thick n-type InP cladding layer 8 with an n-type impurity concentration of $1\times10^{18}$ cm$^{-3}$ and a 0.5-$\mu$m thick n-type InGaAs contact layer 9 with an n-type impurity concentration of $1\times10^{19}$ cm$^{-3}$ are formed by MOCVD. Finally, as shown in FIG. 5F, an n-side electrode 10 is formed on the n-type InGaAs contact layer 9, the resultant substrate is polished, a p-side electrode 11 is formed on the p-type InP substrate 1, and the resultant structures is cleaved into discrete semiconductor lasers. In this manner the semiconductor laser shown in FIG. 4 is fabricated.

In the semiconductor device of the first invention of the present invention, the shape of the n-type current blocking layer is controlled by the doping amount (carrier concentration) of Se as the n-type impurity. FIGS. 6A to 6C illustrate the relationships between the carrier concentration in the n-type current blocking layer and the shape of the n-type current blocking layer. FIGS. 6A, 6B, and 6C show the results when the carrier concentrations are up to $2\times10^{18}$ cm$^{-3}$, up to $6\times10^{18}$ cm$^{-3}$, and up to $2\times10^{19}$ cm$^{-3}$, respectively. Note that all these carrier concentrations are values on a (100) face. As shown in FIGS. 6A to 6C, as the Se carrier concentration increases (from FIG. 6A to FIG. 6C), the crystal growth of InP on the side surfaces of the mesa stripe is suppressed. Especially when the carrier concentration is up to $2\times10^{19}$ cm$^{-3}$, the surface of the n-type InP layer 6 is nearly horizontal to the substrate surface even in portions very close to the side surfaces of the mesa stripe.

As described above, the crystal growth of InP on the side surfaces of the mesa stripe is suppressed as the Se carrier concentration increases. Consequently, the n-type current blocking layer and the n-type cladding layer are more reliably isolated from each other. To isolate the n-type current blocking layer from the n-type cladding layer in conventional devices, it is necessary to precisely control the height and shape of the mesa stripe, the thickness of the p-type InP buried layer, the thickness of the n-type current blocking layer, and the like factor. However, by the use of the first invention of the present invention it is extremely easy to isolate the n-type current blocking layer from the n-type cladding layer.

Furthermore, in conventional devices if the carrier concentration in the n-type current blocking layer is much lower than the carrier concentration in the p-type current blocking layer, Zn as the p-type impurity diffuses into the n-type current blocking layer and partially inverts the n-type current blocking layer into p-type. In this case it is also relatively easy to isolate the n-type current blocking layer from the n-type cladding layer. However, since the carrier concentration in the n-type current blocking layer is low, the current blocking effect of the pnpn structure is small and this increases the leakage current. In the first invention of the present invention, on the other hand, the carrier concentration in the n-type current blocking layer can be set at a very high value. This enhances the current blocking effect compared to that in conventional devices and makes a high-output operation and a high-temperature operation possible.

This embodiment has been described by taking an InGaAsP-based 1.3-$\mu$m band laser as an example. However, the same effect as above can be attained in semiconductor lasers made from other material systems and having other wavelength bands.

(Second Embodiment)

FIG. 7 is a sectional view showing an outline of the structure of one embodiment (semiconductor laser array) of a semiconductor device according to the second invention of the present invention. The number of lasers in the semiconductor laser array of this embodiment is twelve in one element, and FIG. 7 illustrates a portion of the semiconductor laser array.

In FIG. 7, reference numeral 23 denotes a p-type InP buffer/cladding layer with a carrier concentration of $1\times10^{18}$ cm$^{-3}$. A mesa stripe is formed on this layer 23. On top of this mesa stripe, an active layer 22 constituted by a strained multiple quantum well structure consisting of GaInAsP layers having different compositions and an n-type InP cladding layer 21 are stacked. A p-type buried layer 24 for confining light in the transverse direction and improving the reliability, an Si-doped n-type InP layer 25 for trapping carriers, and a semi-insulating (Fe-doped) InP layer 26 are stacked in this order on the side surfaces of the active layer 22.

On the semi-insulating InP layer 26, an Se-doped buried layer 27 containing Se at a high concentration of $5\times10^{19}$ cm$^{-3}$ is so formed as to bury recessed portions on the sides of the mesa stripe in order to planarize the element. A high-resistance InP layer 28 is formed on the Se-doped buried layer 27. An n-side cladding layer 29 is formed on the InP layer 28, and a patterned SiO$_2$ insulating film 32 is formed on the cladding layer 29. An n-side electrode 30 is formed on the cladding layer 29 and the SiO$_2$ insulating film 32. A p-side electrode 31 is formed on the SiO$_2$ insulating film 32.

In the manufacturing process of this semiconductor laser, to obtain p- and n-side electrodes from the surface, the p-type buried layer 24, the Si-doped n-type InP layer 25, and the semi-insulating InP layer 26 are formed on the side surfaces of the active region, the active region is buried with the high-concentration Se-doped buried layer 27 and the high-resistance InP layer 28, the n-side cladding layer 29 is formed, and after that the patterning and photolithography steps must be performed four times or more. However, since the high-concentration Se-doped buried layer 27 has a highly flat surface, patterning can be performed much more accurately than in semiconductor lasers not including the high-concentration Se-doped buried layer 27. Also, a high flatness of the Se-doped buried layer 27 makes it possible to reduce the influence of particles when, for example, the surface of the element is peeled. Accordingly, it is possible to obtain, with a high yield, semiconductor devices superior to conventional elements in characteristics, particularly the uniformity of threshold temperature dependence. A reason for this is assumed that the growth of the high-concentration Se-doped layer is suppressed on the side surfaces of the semi-insulating InP layer 26 and so a high-concentration Se-doped layer preferentially grows in the direction of the flat surface of the InP substrate 23.

FIG. 8 is a sectional view showing an outline of the structure of another embodiment of the semiconductor device according to the second invention of the present invention. This semiconductor device is fabricated by integrating a large number of field-effect transistors, and FIG. 8 illustrates a portion of the device.

In FIG. 8, reference numeral 41 denotes a semi-insulating InP substrate. On this semi-insulating InP substrate 41, an Fe-doped InAlAs buffer layer 42, an InGaAs channel layer 43, an InAlAs spacer layer 44, an InAlAs electron supply layer 45, an InAlAs Schottky contact layer 46, and an InGaAs ohmic contact layer 47 are formed in this order. A trench reaching the depth of a middle portion of the InAlAs Schottky contact layer 46 is formed in a portion of the InGaAs ohmic contact layer 47 and the InAlAs Schottky contact layer 46. A gate electrode 48 is formed in the trench. A source electrode 49 and a drain electrode 50 reaching the InGaAs channel layer 43 are buried in the two side portions of the trench.

In an isolation region which isolates the above transistor from other elements, a recessed portion reaching the Fe-doped InAlAs buffer layer 42 is formed. An Fe-doped InP layer 51 is formed in this recessed portion. On top of the Fe-doped InP layer 51, a high-concentration Se-doped InP layer 52 is so formed as to bury the recessed portion. An insulating interlayer 53 also is formed on the Fe-doped InP layer 51, and a metal interconnection 54 is formed on the insulating interlayer 53.

In the semiconductor device with the above structure, the surface is planarized in the isolation region. Accordingly, the metal interconnection or the insulating interlayer is not disconnected on steps, so the elements can be integrated at a high yield.

FIG. 9 is a sectional view showing an outline of the structure of still another embodiment of the semiconductor device according to the second invention of the present invention. This semiconductor device is a hetero-bipolar transistor, and FIG. 9 illustrates a portion of the device.

In FIG. 9, reference numeral 61 denotes a semi-insulating InP substrate. On this semi-insulating InP substrate 61, an n-type contact layer 62, a p-type InGaAs base layer 63, an n-type InP emitter layer 64, and an n-type InGaAs ohmic contact layer 65 are stacked in this order. In this element region, a trench is formed in the n-type collector layer 62 by removing the layers down to the p-type InGaAs base layer 63, thereby forming a collector region. A collector electrode 68 is formed in this collector region. A base electrode 67 is formed on the p-type InGaAs base layer 63 by removing the layers down to the n-type InP emitter layer 64. An emitter electrode 66 is formed on the n-type InGaAs ohmic contact layer 65.

In an isolation region which isolates the above transistor from other elements, a recessed portion reaching the semi-insulating InP substrate 61 is formed. A semi-insulating InP layer 69 is formed in this recessed portion. On the semi-insulating InP layer 69, a high-concentration Se-doped InP layer 70 is so formed as to bury the recessed portion.

The effect of the present invention is tremendous in a device with the above structure because the fabrication steps are complicated. The effect of the present invention becomes particularly significant as the number of active regions increases to further complicate the element structure. When the semiconductor device of this embodiment was used to perform an operation at frequencies in the microwave region, it was confirmed that the higher the Se concentration the higher the operating speed. A reason for this is considered that the blocking effect acts between the active regions because the carrier concentration in the Se-doped layer is high.

FIG. 10 is a sectional view showing an outline of the structure of still another embodiment of the semiconductor device according to the second invention of the present invention. This semiconductor device is manufactured by integrating semiconductor lasers, optical modulators, and optical waveguides, and FIG. 10 illustrates a portion of the device.

In FIG. 10, reference numeral 71 denotes a semi-insulating InP substrate. On this semi-insulating InP substrate 71, a contact ohmic p-type InGaAs layer 72 for a laser, a p-type InP layer 73, a laser active layer 74, an n-type InP layer 75, an active layer 76 for an optical modulator, a p-type InP layer 77, and a p-type InGaAs ohmic contact layer 78 are formed in this order.

A recessed portion reaching the n-type InP layer 75 is formed outside the optical modulator (on the left side in FIG. 10). Another recessed portion reaching the p-type InP layer 73 is formed outside the semiconductor laser (on the right side in FIG. 10). A first semi-insulating InP buried layer 79 is formed in these two recessed portions. On the first semi-insulating InP buried layer 79, a first high-concentration Se-doped InP layer 80 is so formed as to bury the recessed portions.

Still another recessed portion reaching the semi-insulating InP substrate 71 is formed between the optical modulator and the semiconductor laser. A second semi-insulating InP buried layer 81 is formed in this recessed portion. On the second semi-insulating InP buried layer 81, a second high-concentration Se-doped InP layer 82, a semi-insulating InP layer 83, an optical waveguide layer 84, and a semi-insulating InP layer 85 are formed in this order so as to bury the recessed portion.

Additionally, an SiO$_2$ insulating layer 86 is so formed as to partially expose the laser contact ohmic p-type InGaAs layer 72, the n-type InP layer 75, the 5 modulator active layer 76, the p-type InGaAs ohmic contact layer 78, and the semi-insulating InP layer 85. A p-side electrode 87 is formed on the exposed p-type InGaAs ohmic contact layer 78, and an n-side electrode 88 is formed on the exposed modulator active layer 76. Also, an n-side electrode 89 is formed on the exposed n-type InP layer 75, and a p-side electrode 90 is formed on the exposed laser contact ohmic p-type InGaAs layer 72.

In the device with the above structure, the semiconductor laser is a forward bias element and the modulator is a reverse bias element. Accordingly, insulation between these elements is important. In the above structure, a single element isolation region functions as the current blocking layers of two elements. Therefore, the high-concentration Se-doped region is covered with the semi-insulating layer to facilitate the design of the element structure.

In the above embodiment, after the active region and the isolation region are formed the waveguide is formed by regrowth. The present invention particularly achieves its effect in this respect. That is, in conventional elements it is difficult to precisely control the composition (in this case GaInAsP) of a mixed crystal because the flatness is low after an isolation region is formed. Accordingly, in a region requiring a material having a mixed crystal composition, a flat portion is formed on a wafer by the first growth, an unnecessary region is removed, and an element is formed on the resultant surface. However, by the use of the second invention of the present invention it is possible to evenly bury undulations on the surface even if the undulations are once formed on the surface. Consequently, it is again possible to form the active region using a material having a mixed crystal composition. This increases the degree of freedom of the element design compared to that of conventional devices and makes a three-dimensional structure such as shown in FIG. 10 possible.

In the embodiment in FIG. 10, two active region stages are formed. However, three or more active region stages can also be formed by repeating the etching and the regrowth. Additionally, this device structure is applicable not only to optical devices but also to electronic devices, such as shown in FIGS. 8 and 9, or to some other electronic devices.

The second invention of the present invention is not limited to the materials and the device structures explained in the embodiments but can be applied to various electronic and optical devices. For example, the second invention is applicable to a device structure in which both optical devices and electronic devices are integrated. The second invention can be applied to optical devices such as light-receiving elements, amplifiers, switches, detectors, and devices combining these devices, as well as to semiconductor lasers, modulators, and waveguides. Although the embodiments have been explained by taking burying using InP as an example, in the second invention of the present invention it is only necessary to form a layer doped with Se or S at a high concentration. Therefore, the second invention is applicable to a material system, such as GaAs, combining any of Ga, Al, In, P, and As. If this is the case, however, the concentration range or the mixed crystal material system of Se or S is determined in accordance with each individual material system.

As has been described above, the semiconductor device of the first invention of the present invention comprises a p-type InP substrate having a mesa stripe on top of which at least an active layer and an n-type cladding layer are formed, and a semiconductor layer so formed as to bury side surfaces of the mesa stripe and having at least an n-type current blocking layer and a p-type current blocking layer, wherein the n-type current blocking layer contains approximately $8 \times 10^{17}$ cm$^{-3}$ or more of Se as an impurity and the n-type current blocking layer and the n-type cladding layer are not contacting each other. Accordingly, it is extremely easy to isolate the n-type current blocking layer from the n-type cladding layer. Consequently, an element capable of a high-output operation and a high-temperature operation can be obtained very easily.

The semiconductor device of the second invention of the present invention comprises a base having at least two active regions including an active region formed on a substrate containing InP, and an isolation region for electrically isolating at least a portion of one active region from the other active region, wherein the isolation region has at least a semi-insulating layer and an Se-doped layer containing $5 \times 10^{18}$ to $7 \times 10^{19}$ cm$^{-3}$ of Se as an impurity. Since the element isolation region can be planarized, the process is facilitated and elements having higher performance than conventional elements can be obtained with a high reproducibility and a high uniformity. Additionally, the degree of freedom of element design is increased compared to that of conventional elements, and this makes it possible to obtain three-dimensional elements.

That is, in a semiconductor device having a plurality of active regions in one element, undulations are formed on the surface due to electrical insulation between the elements. To remove these undulations, the undulations are buried with a semiconductor layer, but the resultant surface is difficult to planarize. As a consequence, it becomes difficult to perform patterning and lithography steps or formation of an insulating interlayer after the planarization, or to three dimensionally stack devices after the planarization. The second invention of the present invention can solve these conventional problems.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a p-type InP substrate having a mesa stripe in which at least an active layer and an n-type cladding layer are formed; and
   a semiconductor layer formed so as to bury side surfaces of said mesa stripe, said semiconductor layer having at least an n-type current blocking layer made of an InP-based compound semiconductor, a p-type current blocking layer made of an InP-based compound semiconductor, and a p-type buried layer made of an InP-based compound semiconductor,
   wherein said n-type current blocking layer contains approximately not less than $8 \times 10^{17}$ cm$^{-3}$ of Se as an impurity and said n-type current blocking layer and said n-type cladding layer are not in contact with each other and said p-type buried layer has a surface on which said n-type current blocking layer is inhibited from growing.

2. The device according to claim 1, wherein the Se content in said n-type current blocking layer is $2 \times 10^{18}$ to $5 \times 10^{19}$ cm$^{-3}$.

3. The device according to claim 1, wherein said semiconductor layer contains at least one layer selected from the group consisting of a semi-insulating InP layer, an InGaAlAs layer, an InGaAsP layer, an InGaAs layer, and an InAlAs layer.

4. The device according to claim 1, wherein said mesa stripe contains at least one layer selected from the group consisting of an optical guide layer and an etching dummy layer.

5. The device according to claim 1, wherein the surface of said p-type buried layer is a (221) B face.

6. A method of manufacturing a semiconductor device, comprising the steps of:

forming a stacked film of at least an active layer and an n-type cladding layer on a p-type InP substrate;

processing said stacked film into a mesa stripe shape; and forming a semiconductor film having at least an n-type current blocking layer made of an InP-based compound semiconductor doped with approximately not less than $8 \times 10^{17}$ cm$^{-3}$ of Se as an impurity, a p-type current blocking layer made of an InP-based compound semiconductor, and a p-type buried layer made of an InP-based compound semiconductor so as to bury side surfaces of said mesa stripe, thereby forming a structure in which said n-type current blocking layer and said n-type cladding layer are not in contact with each other and said p-type buried layer has a surface on which said n-type current blocking layer is inhibited from growing.

7. The method according to claim 6, wherein the forming of the p-type buried layer is such that said p-type buried layer contacts the side surfaces of said mesa stripe.

8. The method according to claim 7, wherein said p-type buried layer is so formed as to have at least two crystal faces different in facet directions.

* * * * *